(12) United States Patent
Kirby et al.

(10) Patent No.: US 11,492,298 B2
(45) Date of Patent: Nov. 8, 2022

(54) SILICON BOND COAT WITH COLUMNAR GRAINS AND METHODS OF ITS FORMATION

(71) Applicant: General Electric Company, Schenectady, NY (US)

(72) Inventors: Glen Harold Kirby, Liberty Township, OH (US); Justin Michael Nagy, Newport, KY (US); John Tam Nguyen, Cincinnati, OH (US); Jeffery Allen Bross, Liberty Township, OH (US); Brian Harvey Pilsner, Mason, OH (US); Robert Martin Fecke, Franklin, OH (US)

(73) Assignee: General Electric Company, Schenectady, NY (US)

( * ) Notice: Subject to any disclaimer, the term of this patent is extended or adjusted under 35 U.S.C. 154(b) by 1075 days.

(21) Appl. No.: 16/050,379

(22) Filed: Jul. 31, 2018

(65) Prior Publication Data

US 2020/0039892 A1 Feb. 6, 2020

(51) Int. Cl.
| | |
|---|---|
| *C04B 14/00* | (2006.01) |
| *C04B 41/00* | (2006.01) |
| *C04B 41/50* | (2006.01) |
| *F01D 5/28* | (2006.01) |
| *C23C 28/00* | (2006.01) |
| *C23C 30/00* | (2006.01) |

(52) U.S. Cl.
CPC ........ *C04B 41/009* (2013.01); *C04B 41/5024* (2013.01); *C04B 41/5096* (2013.01); *C23C 28/321* (2013.01); *C23C 28/345* (2013.01); *C23C 30/00* (2013.01); *F01D 5/288* (2013.01); *F05D 2300/6033* (2013.01)

(58) Field of Classification Search
None
See application file for complete search history.

(56) References Cited

U.S. PATENT DOCUMENTS

| | | | |
|---|---|---|---|
| 4,321,311 | A | 3/1982 | Strangman |
| 5,830,586 | A | 11/1998 | Gray et al. |
| 5,876,860 | A | 3/1999 | Marijnissen et al. |
| 6,395,343 | B1 | 5/2002 | Strangman |
| 6,455,173 | B1 | 9/2002 | Marijnissen et al. |
| 6,458,473 | B1 | 10/2002 | Conner et al. |
| 6,482,537 | B1 | 11/2002 | Strangman et al. |
| 7,859,100 | B2 | 12/2010 | Torigoe et al. |
| 9,511,572 | B2 | 12/2016 | Cheruvu et al. |
| 9,771,811 | B2 | 9/2017 | Zhang et al. |
| 2005/0158590 | A1 | 7/2005 | Li |

(Continued)

*Primary Examiner* — Daniel J. Schleis
(74) *Attorney, Agent, or Firm* — Dority & Manning, P.A.

(57) ABSTRACT

Methods for forming a coated component, along with the resulting coated components, are provided. The method may include forming a silicon-based bond coating on a surface of a substrate and forming a barrier coating on the silicon-based bond coating. The silicon-based bond coating comprises columnar grains of crystalline silicon. Chemical vapor depositing (CVD) may be used to form the silicon-based bond coating through CVD of a silicon-containing precursor at a deposition temperature and deposition pressure that causes crystallization of the silicon material during the deposition of the silicon-based bond coating. The silicon-containing precursor may be silane, monochlorosilane, dichlorosilane, and/or trichlorosilane.

20 Claims, 4 Drawing Sheets

(56) References Cited

U.S. PATENT DOCUMENTS

| | | |
|---|---|---|
| 2014/0011038 A1 | 1/2014 | Das et al. |
| 2014/0050929 A1 | 2/2014 | Das |
| 2017/0008125 A1 | 1/2017 | Bruck et al. |
| 2018/0370862 A1 | 12/2018 | Kirby et al. |

SILICON BOND COAT WITH COLUMNAR GRAINS AND METHODS OF ITS FORMATION

FIELD

The present invention generally relates to bond coatings for use with environmental barrier coatings on ceramic components, along with methods of their formation and use.

BACKGROUND

Higher operating temperatures for gas turbine engines are continuously being sought in order to improve their efficiency. However, as operating temperatures increase, the high temperature durability of the components of the engine must correspondingly increase. Significant advances in high temperature capabilities have been achieved through the formulation of iron, nickel, and cobalt-based superalloys. Still, with many hot gas path components constructed from super alloys, thermal barrier coatings (TBCs) can be utilized to insulate the components and can sustain an appreciable temperature difference between the load-bearing alloys and the coating surface, thus limiting the thermal exposure of the structural component.

While superalloys have found wide use for components used throughout gas turbine engines, and especially in the higher temperature sections, alternative lighter-weight substrate materials have been proposed, such as ceramic matrix composite (CMC) materials. CMC and monolithic ceramic components can be coated with environmental barrier coatings (EBCs) to protect them from the harsh environment of high temperature engine sections. EBCs can provide a dense, hermetic seal against the corrosive gases in the hot combustion environment.

Silicon carbide and silicon nitride ceramics undergo oxidation in dry, high temperature environments. This oxidation produces a passive, silicon oxide scale on the surface of the material. In moist, high temperature environments containing water vapor, such as a turbine engine, both oxidation and recession occurs due to the formation of a passive silicon oxide scale and subsequent conversion of the silicon oxide to gaseous silicon hydroxide. To prevent recession in moist, high temperature environments, environmental barrier coatings (EBC's) are deposited onto silicon carbide and silicon nitride materials.

Currently, EBC materials are made out of rare earth silicate compounds. These materials seal out water vapor, preventing it from reaching the silicon oxide scale on the silicon carbide or silicon nitride surface, thereby preventing recession. Such materials cannot prevent oxygen penetration, however, which results in oxidation of the underlying substrate. Oxidation of the substrate yields a passive silicon oxide scale, along with the release of carbonaceous or nitrous oxide gas. The carbonaceous (i.e., $CO$, $CO2$) or nitrous (i.e., $NO$, $NO2$, etc.) oxide gases cannot escape out through the dense EBC and thus, blisters form. The use of a silicon bond coating has been the solution to this blistering problem to date. The silicon bond coating provides a layer that oxidizes (forming a passive silicon oxide layer beneath the EBC) without liberating a gaseous by-product.

However, the presence of a silicon bond coating limits the upper temperature of operation for the EBC because the melting point of silicon metal is relatively low. In use, the silicon bond coating melts at coating temperatures of about 1414° C., which is the melting point of silicon metal. Above these melting temperatures, the silicon bond coating may delaminate from the underlying substrate, effectively removing the bond coat and the EBC thereon. As such, it is desirable to improve the properties of a silicon bond coating in the EBC to achieve a higher operational temperature limit for the EBC.

If the silicon bond coat contains linear defects (e.g. cracks) either via the manufacturing process or during service, particularly linear defects that span the entire layer thickness, the silicon bond coat may fail to provide the oxidation protection at that location. Such a breach may lead to local oxidation of the substrate and liberation of gas that can blister and rupture the overlying EBC or in worst case, lead to delamination of large sections of EBC. In either case, the missing EBC allows for high temperature steam to penetrate and corrosively attack the underlying substrate. As-manufactured silicon bond coats via air plasma spray (APS) tend to contain microstructural features that can result in low cohesive strength of the bond coat. Furthermore, silicon bond coats manufactured via chemical vapor deposition (CVD) can have large grain size in EBC systems. Since the overlying rare earth silicate layers are processed at temperatures higher than CVD silicon processing temperatures, grain growth occurs and can result in grains that comprise the entire thickness of the bond coat. According to the Hall-Petch relationship, it is known that enormous grains in a material produce a knock-down in mechanical capability relative to the same material with fine grains.

As such, there is a need for improved bond coats with CMC substrates for use with EBCs.

BRIEF DESCRIPTION

Aspects and advantages will be set forth in part in the following description, or may be obvious from the description, or may be learned through practice of the invention.

Methods are generally provided for forming a coated component, along with the resulting coated components. In one embodiment, the method includes forming a silicon-based bond coating on a surface of a substrate and forming a barrier coating on the silicon-based bond coating. The silicon-based bond coating comprises columnar grains of crystalline silicon.

In one embodiment, forming the silicon-based bond coating on the surface of the substrate comprises: chemical vapor depositing (CVD) a silicon-containing precursor at a deposition temperature (e.g., about 900° C. to about 1150° C., such as about 1100° C. to about 1150° C.) and deposition pressure (e.g., about 115 torr to about 150 torr, such as about 125 torr to about 135 torr) that causes crystallization of the silicon material during the deposition of the silicon-based bond coating. For example, the silicon-containing precursor comprises silane, monochlorosilane, dichlorosilane, and/or trichlorosilane. During the CVD process, the silicon-containing precursor has a flow rate of about 0.05 grams/minute to about 0.3 grams/minute (e.g., about 0.1 grams/minute to about 0.2 grams/minute).

In one particular embodiment, the silicon material is silicon metal such that the silicon-based bond coating comprises columnar grains of crystalline silicon metal.

The columnar grains of crystalline silicon may have an average width of about 1 µm to about 15 µm while spanning at least about 50% of the thickness of the silicon-based bond coating. The silicon-based bond coating may have thickness that is about 25 µm to about 275 µm.

In one embodiment, the coated component (e.g., a turbine component) may include a substrate having a surface; a silicon-based bond coating on the surface of the substrate, wherein the silicon-based bond coating comprises columnar grains of crystalline silicon; and a barrier coating on the silicon-based bond coating. The amorphous silicon phase may comprise silicon metal, a silicon alloy, a silicide, or a mixture thereof.

These and other features, aspects and advantages will become better understood with reference to the following description and appended claims. The accompanying drawings, which are incorporated in and constitute a part of this specification, illustrate embodiments of the invention and, together with the description, serve to explain certain principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended FIGS., in which.

Figure 1:
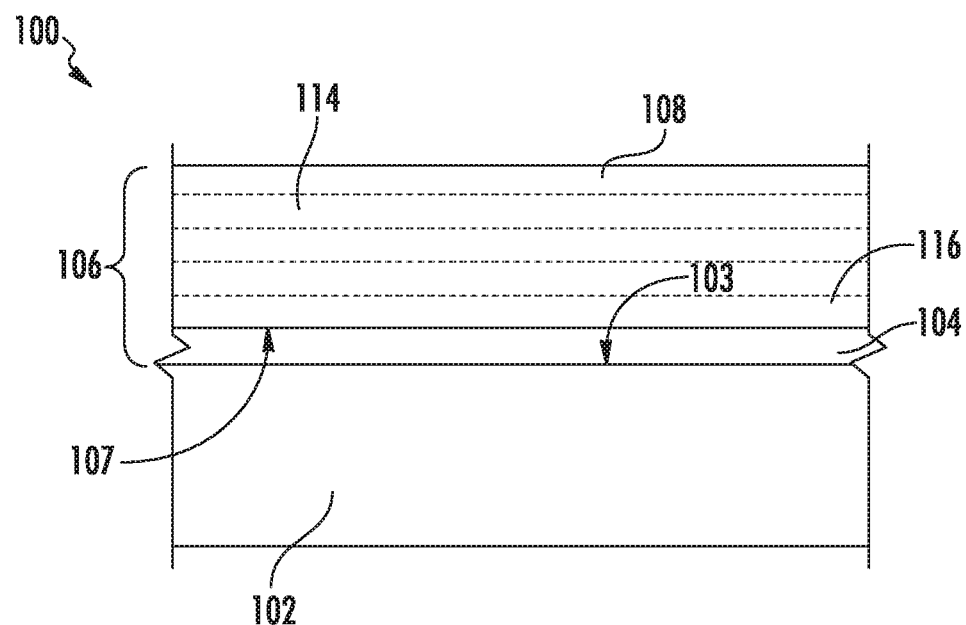
FIG. 1 is a cross-sectional side view of an exemplary coated component including a silicon-based bond coating.

Repeat use of reference characters in the present specification and drawings is intended to represent the same or analogous features or elements of the present invention.

DETAILED DESCRIPTION OF PARTICULAR EMBODIMENTS

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

Chemical elements are discussed in the present disclosure using their common chemical abbreviation, such as commonly found on a periodic table of elements. For example, hydrogen is represented by its common chemical abbreviation H; helium is represented by its common chemical abbreviation He; and so forth. As used herein, "Ln" refers to a rare earth element or a mixture of rare earth elements.

More specifically, the "Ln" refers to the rare earth elements of scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), or mixtures thereof.

As used herein, the term "substantially free" means no more than an insignificant trace amount present and encompasses completely free (e.g., 0 molar % up to 0.01 molar %).

In the present disclosure, when a layer is being described as "on" or "over" another layer or substrate, it is to be understood that the layers can either be directly contacting each other or have another layer or feature between the layers, unless expressly stated to the contrary. Thus, these terms are simply describing the relative position of the layers to each other and do not necessarily mean "on top of" since the relative position above or below depends upon the orientation of the device to the viewer.

A coated component is provided that includes a silicon-based bond coating positioned between the surface of the substrate and a barrier coating (e.g., EBC) thereon, along with methods of its formation and use. The silicon-based bond coating generally has a microstructure that is largely crystalline silicon material with columnar grains of silicon. It has been found that such a silicon-based bond coating is stronger relative to a bond coating having a crystalline silicon microstructure with very large grains. As such, the silicon-based bond coating may bond the substrate to the barrier coating (e.g., EBC) thereon, as well as gettering of oxygen without releasing gas to prevent oxidation of the underlying substrate that would otherwise result in a gaseous by-product.

Figure 2:
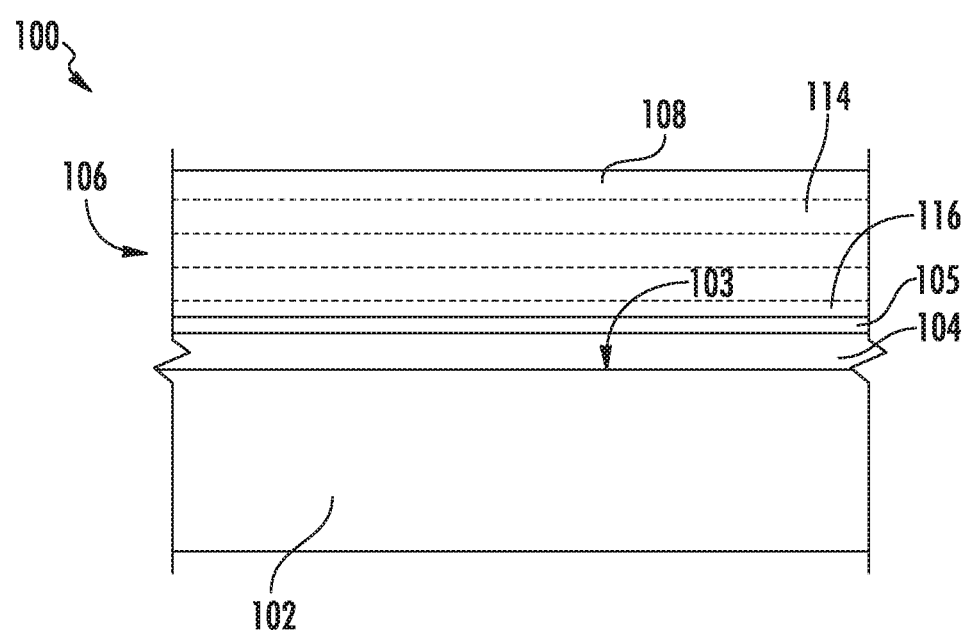
FIG. 2 is another cross-sectional side view of an exemplary coated component including a silicon-based bond coating with a thermally grown oxide layer thereon.

Referring to FIG. 1, an exemplary coated component 100 is shown formed from a substrate 102 having a surface 103 with a coating system 106 thereon. Generally, the coating system 106 includes a silicon-based bond coating 104 on the surface 103 of the substrate, and an EBC 108 on the silicon-based bond coating 104. In the embodiment shown, the silicon-based bond coating 104 is directly on the surface 103 without any layer therebetween. However, in other embodiments, one or more layers can be positioned between the silicon-based bond coating 104 and the surface 103. FIG. 2 shows a thermally grown oxide ("TGO") layer 105, which may form on the surface of the silicon-based bond coating 104, such as a layer of silicon oxide (sometimes referred to as "silicon oxide scale" or "silica scale"), during exposure to oxygen (e.g., during manufacturing and/or use) of the component 100.

Figure 3:
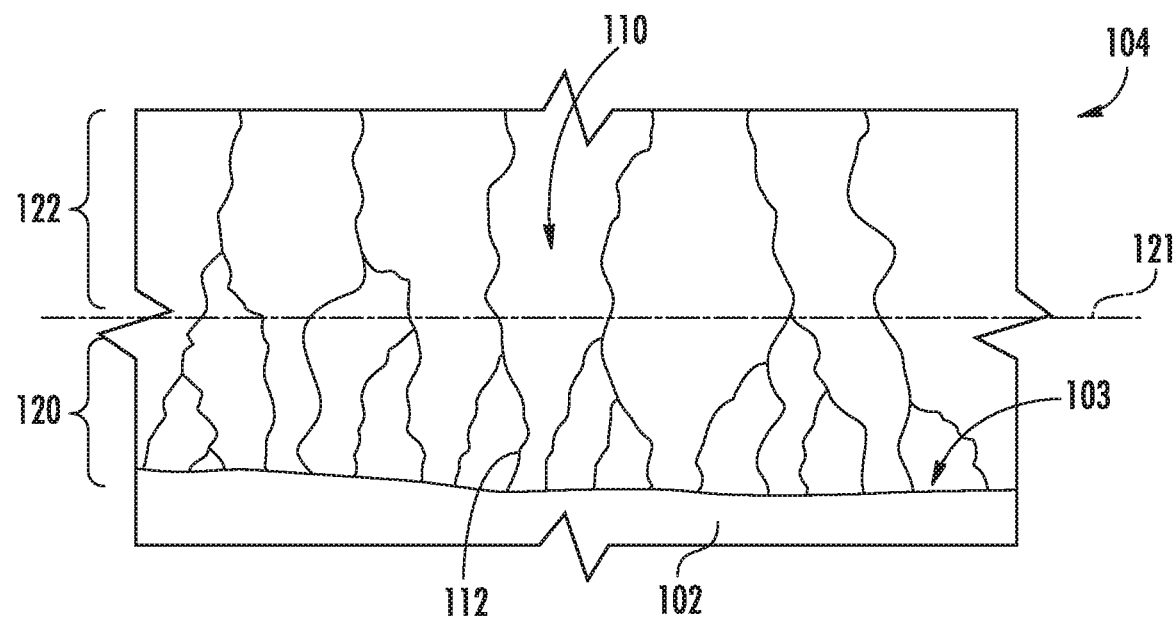
FIG. 3 is a cross-sectional side view of an exemplary silicon-based bond coating having columnar grains of crystalline silicon.
Figure 4:
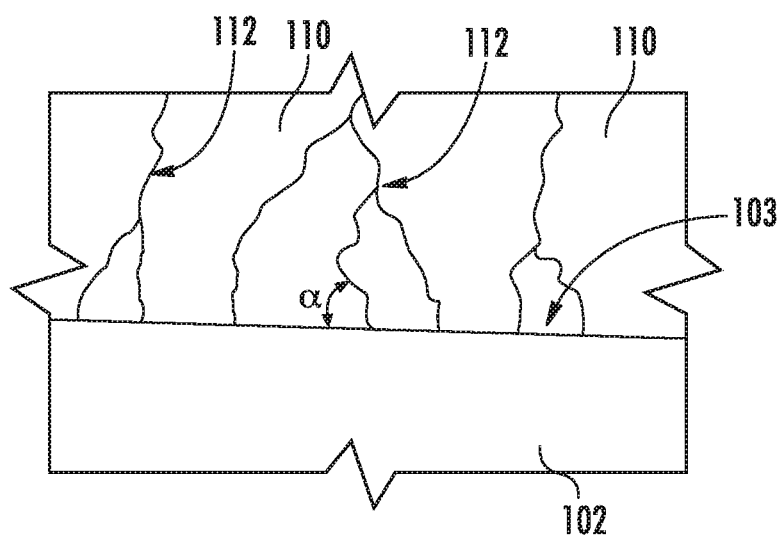
FIG. 4 is a cross-sectional side view of another exemplary silicon-based bond coating having columnar grains of crystalline silicon.

FIG. 3 shows a close-up cross-section of exemplary silicon-based bond coating 104, such as for use in the exemplary coated component 100 of FIG. 1 or 2, having columnar grains 110 of crystalline silicon extending from the surface 103 of the substrate 102. Referring to FIG. 3, the columnar grains 110 of crystalline silicon have grain walls 112 that extend in a direction that is generally orthogonal to the surface 103. As shown in FIG. 4, the grain walls 112 may extend into the thickness of the silicon-based bond coating 104 from the surface 103 at a minimum angle $\alpha$ of about 65° to the surface 103, such as a minimum angle $\alpha$ of about 75°. In certain In particular embodiments, grains 110 may have an the average width of about 1 μm to about 15 μm. The grain walls 112 may have an average height of about 25 μm to about 100 μm.

In particular embodiments, the size of the grains 110 are generally smaller along the surface 103 of the substrate 102 than on the opposite side adjacent to the inner surface 107 of the barrier coating 106. For example, the inner half 120 of the silicon-based bond coating 104, which is defined from the surface 103 of the substrate 102 to a line 121 at the middle of the thickness of the silicon-based bond coating 104, may have smaller grains 110 in terms of width and may have more grains per area in the cross-section compared to the outer half 122. Conversely, the outer half 122 of the silicon-based bond coating 104, which is defined from the middle line 121 to the inner surface 107 of the barrier coating 106, may have larger grains 110 in terms of width and may have less grains per area in the cross-section than the number of grains in the inner half 120.

In the embodiment of FIG. 3, the columnar grains 110 of crystalline silicon form a 3-dimensional network that spans the thickness of the silicon-based bond coating 104 and is bonded to the surface 103 of the substrate 102 and to an inner surface 107 of the barrier coating 106. Generally, the silicon-based bond coating 104 is relatively thin. In particular embodiments, the silicon-based bond coating 104 may have a thickness that is about 25 micrometers (μm) to about 275 μm, such as about 25 μm to about 150 μm (e.g., about 25 μm to about 100).

The silicon-based bond coating 104 may include silicon metal, a silicon alloy (e.g., a silicon eutectic alloy), a silicide, or a mixture thereof. In one particular embodiment, the silicon-based bond coating 104 includes pure silicon metal.

In one particular embodiment, the silicon-based bond coating 104 is formed using a chemical vapor deposition (CVD) process using a silicon-containing precursor (e.g., silane, monochlorosilane, dichlorosilane, and/or trichlorosilane) at particular deposition temperature and deposition pressure to deposit the coating. In particular embodiments, the silicon-containing precursor has a flow rate of about 0.05 grams/minute to about 0.3 grams/minute (e.g., about 0.1 grams/minute to about 0.2 grams/minute). Without wishing to be bound by any particular theory, it is believed that these deposition temperatures and pressures cause crystallization of the silicon-based bond coating 104 that form columnar grains during its formation.

For example, the deposition temperature may be about 900° C. to about 1150° C. (e.g., about 1100° C. to about 1150° C.), and/or the deposition pressure may be about 115 torr to about 150 torr (e.g., about 125 torr to about 135 torr). At these deposition temperatures and pressures, the silicon material may crystalize on the surface 103 of the component 102 forming the columnar grains thereon.

Referring again to FIGS. 1 and 2, the substrate 102 may be formed from a ceramic matrix composite ("CMC") material, such as a silicon based, non-oxide ceramic matrix composite. As used herein, "CMC" refers to a silicon-containing, or oxide-oxide, matrix and reinforcing material. As used herein, "monolithic ceramics" refers to materials without fiber reinforcement (e.g., having the matrix material only). Herein, CMCs and monolithic ceramics are collectively referred to as "ceramics."

Some examples of CMCs acceptable for use herein can include, but are not limited to, materials having a matrix and reinforcing fibers comprising non-oxide silicon-based materials such as silicon carbide, silicon nitride, silicon oxycarbides, silicon oxynitrides, and mixtures thereof. Examples include, but are not limited to, CMCs with silicon carbide matrix and silicon carbide fiber; silicon nitride matrix and silicon carbide fiber; and silicon carbide/silicon nitride matrix mixture and silicon carbide fiber. Furthermore, CMCs can have a matrix and reinforcing fibers comprised of oxide ceramics. Specifically, the oxide-oxide CMCs may be comprised of a matrix and reinforcing fibers comprising oxide-based materials such as aluminum oxide ($Al_2O_3$), silicon dioxide ($SiO_2$), aluminosilicates, and mixtures thereof. Aluminosilicates can include crystalline materials such as mullite ($3Al_2O_3 \cdot 2SiO_2$), as well as glassy aluminosilicates.

As stated above, the silicon-based bond coating 104 may be used in conjunction with a barrier coating 108 (e.g., EBC) to form a coated component 100 with an increased operating temperature compared to that using only a silicon bond coating. The barrier coating 108 may include any combination of one or more layers formed from materials selected from typical EBC or thermal barrier coating ("TBC") layer chemistries, including but not limited to rare earth silicates (e.g., mono-silicates and di-silicates), aluminosilicates (e.g., mullite, barium strontium aluminosilicate (BSAS), rare earth aluminosilicates, etc.), hafnia, zirconia, stabilized hafnia, stabilized zirconia, rare earth hafnates, rare earth zirconates, rare earth gallium oxide, etc.

The barrier coating 108 may be formed from a plurality of individual layers 114. In the embodiments shown, barrier coating 108 includes a hermetic layer 116 positioned in directly on the silicon-based bond coating 104. However, in other embodiments, the hermetic layer 116 may be positioned elsewhere within the EBC 108.

The coated component 100 is particularly suitable for use as a component found in high temperature environments, such as those present in gas turbine engines, for example, combustor components, turbine blades, shrouds, nozzles, heat shields, and vanes. In particular, the turbine component can be a CMC component positioned within a hot gas flow path of the gas turbine such that the coating system 106 forms an environmental barrier for the underlying substrate 102 to protect the component 100 within the gas turbine when exposed to the hot gas flow path.

Figure 5:
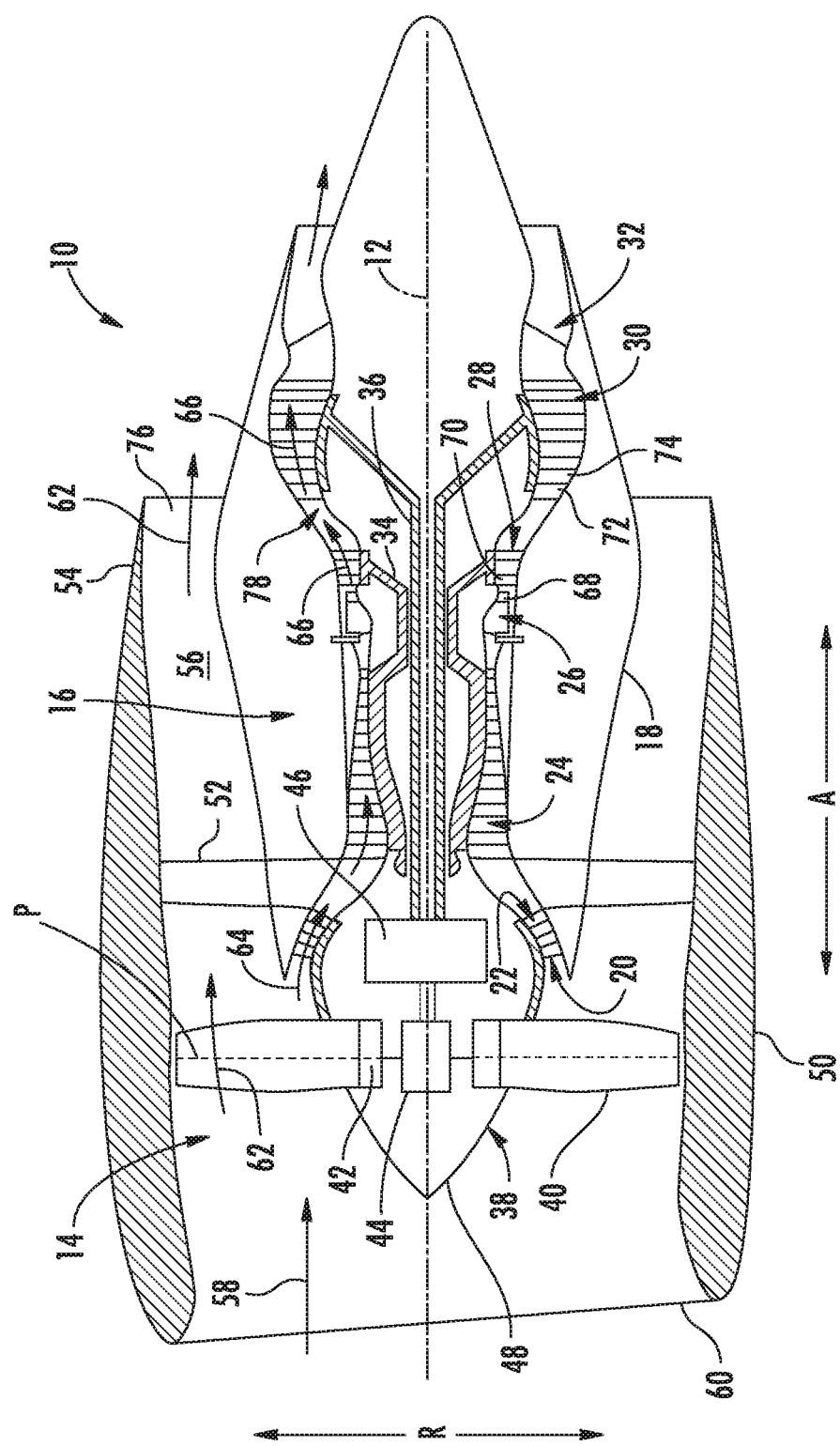
FIG. 5 is a schematic cross-sectional view of an exemplary gas turbine engine according to various embodiments of the present subject matter.

FIG. 5 is a schematic cross-sectional view of a gas turbine engine in accordance with an exemplary embodiment of the present disclosure. More particularly, for the embodiment of FIG. 5, the gas turbine engine is a high-bypass turbofan jet engine 10, referred to herein as "turbofan engine 10." As shown in FIG. 5, the turbofan engine 10 defines an axial direction A (extending parallel to a longitudinal centerline 12 provided for reference) and a radial direction R. In general, the turbofan 10 includes a fan section 14 and a core turbine engine 16 disposed downstream from the fan section 14. Although described below with reference to a turbofan engine 10, the present disclosure is applicable to turbomachinery in general, including turbojet, turboprop and turboshaft gas turbine engines, including industrial and marine gas turbine engines and auxiliary power units.

The exemplary core turbine engine 16 depicted generally includes a substantially tubular outer casing 18 that defines an annular inlet 20. The outer casing 18 encases, in serial flow relationship, a compressor section including a booster or low pressure (LP) compressor 22 and a high pressure (HP) compressor 24; a combustion section 26; a turbine section including a high pressure (HP) turbine 28 and a low pressure (LP) turbine 30; and a jet exhaust nozzle section 32. A high pressure (HP) shaft or spool 34 drivingly connects the HP turbine 28 to the HP compressor 24. A low pressure (LP) shaft or spool 36 drivingly connects the LP turbine 30 to the LP compressor 22.

For the embodiment depicted, the fan section 14 includes a variable pitch fan 38 having a plurality of fan blades 40 coupled to a disk 42 in a spaced apart manner. As depicted, the fan blades 40 extend outwardly from disk 42 generally along the radial direction R. Each fan blade 40 is rotatable relative to the disk 42 about a pitch axis P by virtue of the fan blades 40 being operatively coupled to a suitable actuation member 44 configured to collectively vary the pitch of the fan blades 40 in unison. The fan blades 40, disk 42, and actuation member 44 are together rotatable about the longitudinal axis 12 by LP shaft 36 across an optional power gear box 46. The power gear box 46 includes a plurality of gears for stepping down the rotational speed of the LP shaft 36 to a more efficient rotational fan speed.

Referring still to the exemplary embodiment of FIG. 5, the disk 42 is covered by rotatable front nacelle 48 aerodynamically contoured to promote an airflow through the plurality of fan blades 40. Additionally, the exemplary fan section 14 includes an annular fan casing or outer nacelle 50 that circumferentially surrounds the fan 38 and/or at least a portion of the core turbine engine 16. It should be appreciated that the nacelle 50 may be configured to be supported relative to the core turbine engine 16 by a plurality of circumferentially-spaced outlet guide vanes 52. Moreover, a downstream section 54 of the nacelle 50 may extend over an outer portion of the core turbine engine 16 so as to define a bypass airflow passage 56 therebetween.

During operation of the turbofan engine 10, a volume of air 58 enters the turbofan 10 through an associated inlet 60 of the nacelle 50 and/or fan section 14. As the volume of air 58 passes across the fan blades 40, a first portion of the air 58 as indicated by arrows 62 is directed or routed into the bypass airflow passage 56 and a second portion of the air 58 as indicated by arrow 64 is directed or routed into the LP compressor 22. The ratio between the first portion of air 62 and the second portion of air 64 is commonly known as a bypass ratio. The pressure of the second portion of air 64 is then increased as it is routed through the high pressure (HP) compressor 24 and into the combustion section 26, where it is mixed with fuel and burned to provide combustion gases 66.

The combustion gases 66 are routed through the HP turbine 28 where a portion of thermal and/or kinetic energy from the combustion gases 66 is extracted via sequential stages of HP turbine stator vanes 68 that are coupled to the outer casing 18 and HP turbine rotor blades 70 that are coupled to the HP shaft or spool 34, thus causing the HP shaft or spool 34 to rotate, thereby supporting operation of the HP compressor 24. The combustion gases 66 are then routed through the LP turbine 30 where a second portion of thermal and kinetic energy is extracted from the combustion gases 66 via sequential stages of LP turbine stator vanes 72 that are coupled to the outer casing 18 and LP turbine rotor blades 74 that are coupled to the LP shaft or spool 36, thus causing the LP shaft or spool 36 to rotate, thereby supporting operation of the LP compressor 22 and/or rotation of the fan 38.

The combustion gases 66 are subsequently routed through the jet exhaust nozzle section 32 of the core turbine engine 16 to provide propulsive thrust. Simultaneously, the pressure of the first portion of air 62 is substantially increased as the first portion of air 62 is routed through the bypass airflow passage 56 before it is exhausted from a fan nozzle exhaust section 76 of the turbofan 10, also providing propulsive thrust. The HP turbine 28, the LP turbine 30, and the jet exhaust nozzle section 32 at least partially define a hot gas path 78 for routing the combustion gases 66 through the core turbine engine 16.

Figure 6:
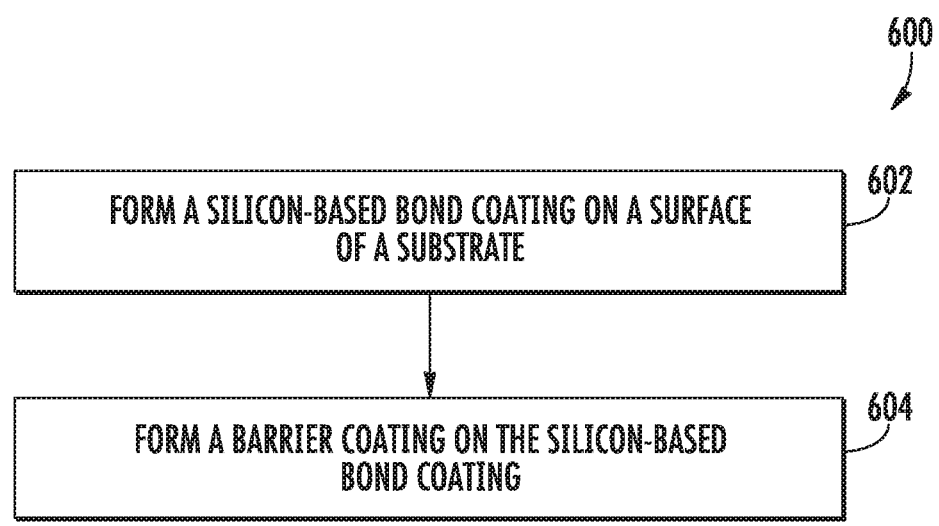
FIG. 6 is a diagram of an exemplary method of forming a silicon-based bond coating with columnar grains of crystalline silicon.

Methods are also generally provided for coating a ceramic component. For example, FIG. 6 shows a diagram of an exemplary method 600 of forming a coating system on a surface of a substrate. At 602, a silicon-based bond coating is formed on the surface of the substrate to include columnar grains of crystalline silicon. As described above, the silicon-based bond coating is formed, in one embodiment, via chemical vapor deposition at particular temperatures, pressures, and/or flow rates. At 604, an environmental barrier coating (EBC) is formed on the silicon-based bond coating.

This written description uses exemplary embodiments to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A coated component comprising:
    a substrate having a surface;
    a silicon-based bond coating on the surface of the substrate, wherein the silicon-based bond coating comprises columnar grains of crystalline silicon; and
    a barrier coating on the silicon-based bond coating.

2. The coated component as in claim 1, the silicon-based bond coating comprises silicon metal, a silicon alloy, a silicide, or a mixture thereof.

3. The coated component as in claim 1, the silicon-based bond coating comprises silicon metal.

4. The coated component as in claim 1, wherein the columnar grains of crystalline silicon have an average width of about 1 µm to about 15 µm while spanning at least about 50% of a thickness of the silicon-based bond coating.

5. The coated component as in claim 1, wherein the silicon-based bond coating has a thickness that is about 25 µm to about 275 µm.

6. The coated component as in claim 1, wherein the substrate comprises a ceramic matrix composite (CMC) comprising silicon carbide, silicon nitride, or a combination thereof, and wherein the substrate comprises a plurality of CMC plies.

7. A turbine component, comprising:
    a substrate comprising a ceramic matrix composite, wherein the substrate has a surface;
    a silicon-based bond coating on the surface of the substrate, wherein the silicon-based bond coating comprises columnar grains of crystalline silicon; and
    a barrier coating on the silicon-based bond coating.

8. A method of forming the coated component of claim 1, the method comprising:
    forming a silicon-based bond coating on a surface of a substrate, wherein the silicon-based bond coating comprises columnar grains of crystalline silicon; and
    forming a barrier coating on the silicon-based bond coating.

9. The method of claim 8, wherein forming the silicon-based bond coating on the surface of the substrate comprises:
    chemical vapor depositing a silicon-containing precursor at a deposition temperature and deposition pressure that causes crystallization of the silicon-containing precursor during the deposition of the silicon-based bond coating to form the columnar grains of crystalline silicon.

10. The method of claim 9, wherein the silicon-containing precursor comprises silane, monochlorosilane, dichlorosilane, and/or trichlorosilane.

11. The method of claim 10, wherein the silicon-containing precursor has a flow rate of about 0.05 grams/minute to about 0.3 grams/minute.

12. The method of claim 10, wherein the silicon-containing precursor has a flow rate of about 0.1 grams/minute to about 0.2 grams/minute.

13. The method of claim 9, wherein the deposition temperature is about 900° C. to about 1150° C.

14. The method of claim 9, wherein the deposition temperature is about 1100° C. to about 1150° C.

15. The method of claim 9, wherein the deposition pressure is about 115 torr to about 150 torr.

16. The method of claim 9, wherein the deposition pressure is about 125 torr to about 135 torr.

17. The method of claim 9, wherein the silicon-containing precursor is silicon metal such that the silicon-based bond coating comprises columnar grains of crystalline silicon metal.

18. The method of claim 8, wherein the columnar grains of crystalline silicon have an average width of about 1 µm to about 15 µm while spanning at least about 50% of a the thickness of the silicon-based bond coating.

19. The method of claim 8, wherein the silicon-based bond coating has a thickness that is about 25 µm to about 275 µm.

20. The method of claim 8, wherein the substrate comprises a ceramic matrix composite (CMC) comprising silicon carbide, silicon nitride, or a combination thereof, and wherein the substrate comprises a plurality of CMC plies.

* * * * *